United States Patent [19]
Brayton et al.

[11] Patent Number: 5,142,239
[45] Date of Patent: Aug. 25, 1992

[54] HIGH FREQUENCY LINEAR AMPLIFIER ASSEMBLY

[75] Inventors: Daniel C. Brayton, Covina; Ngai-Ming Lau, Rowland Heights, both of Calif.

[73] Assignee: Motorola, Inc., Schaumburg, Ill.

[21] Appl. No.: 702,490

[22] Filed: May 20, 1991

[51] Int. Cl.⁵ .............................................. H03F 3/26
[52] U.S. Cl. ..................................... 350/66; 330/276
[58] Field of Search ................... 330/66, 67, 68, 276, 330/311, 165, 65

[56] References Cited

U.S. PATENT DOCUMENTS

| | | | |
|---|---|---|---|
| 3,368,150 | 2/1968 | Worcester | 330/68 |
| 4,151,479 | 4/1979 | Baba | 330/65 X |
| 4,612,512 | 9/1986 | Powell et al. | 330/66 |

Primary Examiner—Steven Mottola
Attorney, Agent, or Firm—Joe E. Barbee

[57] ABSTRACT

A wide bandwidth linear amplifier (10) that has an operating band in excess of 1 GHz mounts the high power dissipating components (11) of the amplifier (10), and the components 917, 18) that control the high frequency gain and stability of the amplifier (10) onto a daughter board (32) that has a high thermal conductivity. The daughter board (32) and the remaining circuit components (21, 22, 23, 24, 26a, 26b) are then mounted on a mother board (31) that has a lower thermal conductivity. The assembly (30) reduces the circuit's parasitic inductance (46, 47, 48, 49) and parasitic capacitance (51, 52), and provides unconditional stability at high frequencies.

20 Claims, 3 Drawing Sheets

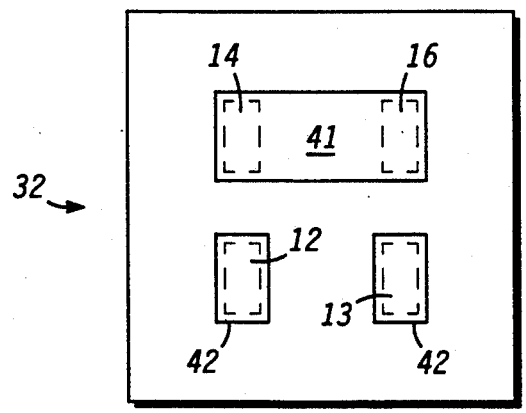
FIG. 3
FIG. 4
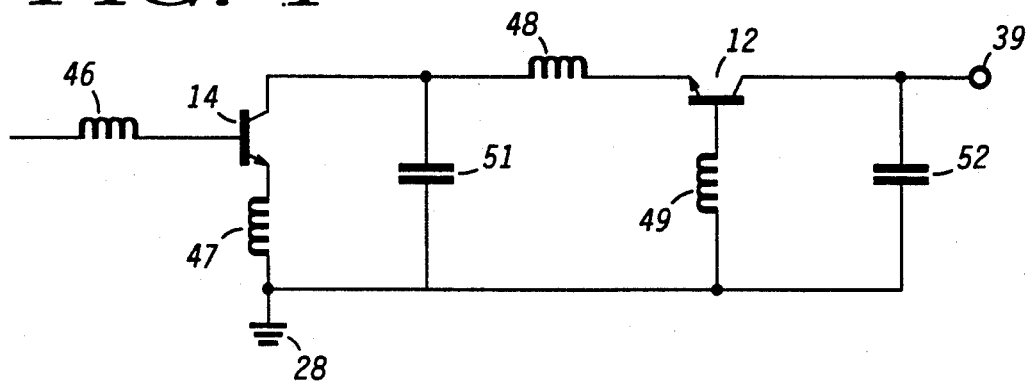
FIG. 5
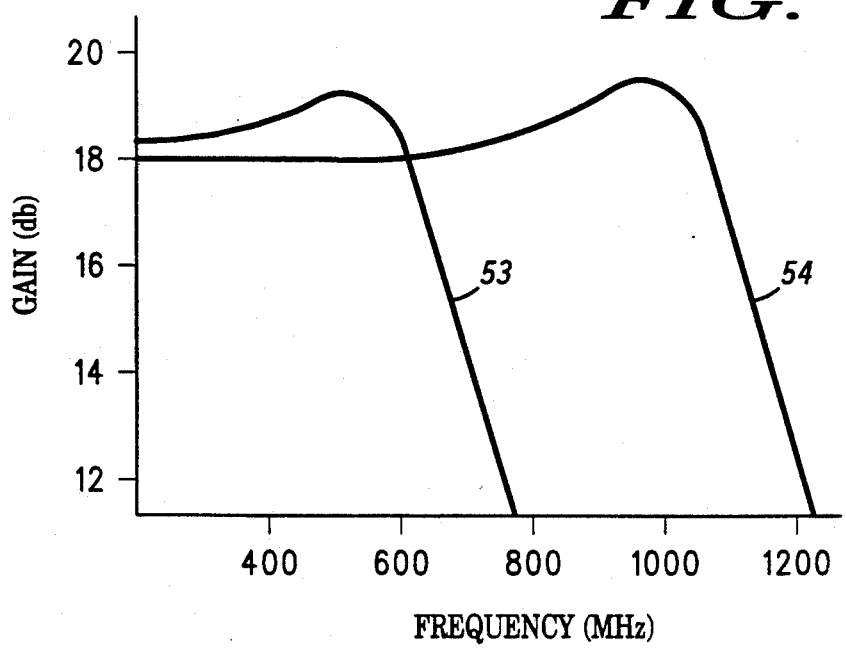

, 142,239

HIGH FREQUENCY LINEAR AMPLIFIER ASSEMBLY

BACKGROUND OF THE INVENTION

The present invention relates, in general, to hybrid circuit assemblies, and more particularly, to a novel linear amplifier circuit assembly that provides a wide bandwidth and a high operating frequency.

Previously, the cable television (CATV) industry had used hybrid circuit manufacturing techniques to build low cost cascode amplifiers that provide linear amplification of CATV's high frequency signals. Among other things, the previous amplifiers generally were required to have a low cost, a wide bandwidth, and a gain that was flat within several tenths of a decibel (db). Generally, the amplifier's gain rolled off rapidly at frequencies above 600 MHz. The recent increase in cable television channels from 77 to 151, and the development of high power direct satellite transmission to the home has increased the need for linear amplifier assemblies having a maximum operating frequency above the 600 megahertz (MHz) limitation of previous linear amplifier assemblies. A typical amplifier is disclosed in U.S. Pat. No. 3,895,306 issued to Paul L. Rebels on Jul. 15, 1975 which is hereby incorporated herein by reference.

Elements of the cascode amplifier circuit were typically mounted on an aluminum oxide filled ceramic (alumina) substrate. In most cases, each semiconductor die of the amplifier was attached to a heat spreader that was on the alumina substrate. Each heat spreader typically was a small platform of high thermal conductivity material such as metal that was mounted between a semiconductor die and the alumina substrate. Each heat spreader absorbed a portion of the heat generated by a semiconductor die to assist in dissipating the heat. Wire bonds were used to provide electrical connection between each semiconductor die and metal interconnect patterns that were on the alumina substrate. Because the bonding wires between each semiconductor die and the interconnecting patterns on the alumina substrate had to pass over the die's heat spreader, the bonding wires were very long. The unusually long bonding wires had a high parasitic inductance that made the amplifier unstable at high frequencies and limited the amplifier's bandwidth.

Another parasitic element was added by the heat spreader itself. Since the heat spreader was a conductor that contacted the back of the semiconductor die, the heat spreader formed a parasitic collector to ground capacitance, thereby adding to the amplifier's bandwidth reduction and instability.

Accordingly, it is desirable to have a high frequency linear amplifier assembly that has a low cost, that has low parasitic inductance, that has low parasitic capacitance, that has high thermal conductivity, and that has a gain which is substantially flat up to frequencies in excess of 600 MHz.

SUMMARY OF THE INVENTION

Briefly stated, the present invention is achieved by mounting the high power dissipating components of an amplifier, and the components that control the high frequency gain and stability of the amplifier onto a daughter board that has a high thermal conductivity. The daughter board and the remaining circuit components are then mounted on a mother board that has a lower thermal conductivity. The assembly reduces the circuit's parasitic inductance and parasitic capacitance, and provides unconditional stability at high frequencies.

BRIEF DESCRIPTION OF THE DRAWINGS

FIG. 3 illustrates a bottom view of the daughter board of FIG. 2 in accordance with the present invention;

FIG. 4 is a schematic illustration of an embodiment of a portion of a linear amplifier illustrating the parasitic elements of the amplifier in accordance with the present invention; and FIG. 5 is a graph illustration the gain of a previous linear amplifier and the gain of a linear amplifier in accordance with the present invention.

DETAILED DESCRIPTION OF THE DRAWINGS

The present invention provides a low cost, high frequency hybrid amplifier that has a gain that is substantially flat to frequencies in excess of 1 GHz. Achieving the amplifier's high operating frequency includes mounting high power dissipation components on a daughter board that has high thermal conductivity. The amplifier's semiconductor die are attached directly to the daughter board which reduces the semiconductor die's collector to ground capacitance. The daughter board's high thermal conductivity enables wire bonds that electrically connect the semiconductor die to the daughter board to be short and have very low parasitic inductance. The low parasitic inductance and low collector to ground capacitance provide an amplifier that is unconditionally stable at frequencies in excess of 1 GHz.

Figure 1:
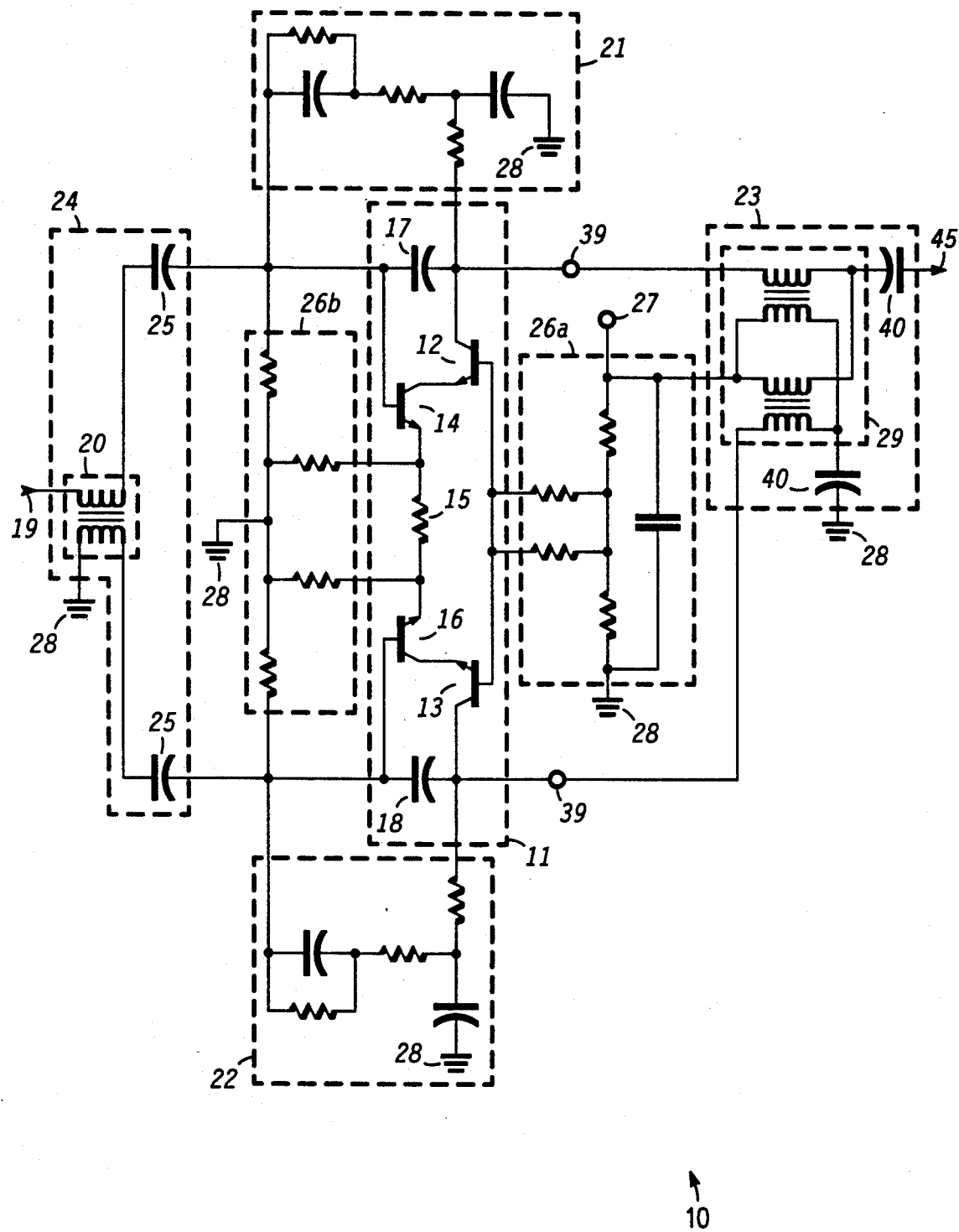
FIG. 1 is a schematic illustration of an embodiment of a linear amplifier circuit suitable for use with the current invention.

Referring to FIG. 1, a high frequency linear amplifier 10 includes an active section 11, a feedback section 21, a feedback section 22, an input coupling section 24, an output coupling section 23, and biasing sections 26a and 26b. A power supply terminal 27 and a power return terminal 28 provide a means for supplying power to linear amplifier 10. For convenience, power return terminal 28 is shown in several different places in FIG. 1. Signals to be amplified by linear amplifier 10 are applied to an input terminal 19. An output terminal 45 typically couples the amplified output signals of linear amplifier 10 to the center conductor of a coax cable. The coax's shield is generally connected to power return terminal 28. Active section 11 contains a push-pull cascode circuit with two symmetrical sections that amplify signals from input coupling section 24. An in-phase section includes a common emitter transistor 14, a common base transistor 12, and a feedback capacitor 17. An out-of-phase section includes a common emitter transistor 16, a common base transistor 13, and a feedback capacitor 18. A resistor 15 provides a feedback path between the two sections of the cascode amplifier. Feedback capacitors 17 and 18 control the stability and gain of active section 11 at frequencies that are above the maximum in-band frequency of amplifier 10, commonly called the out-of-band frequencies. In this high frequency out-of-band range, the gain and stability of active section 11 are typically controlled to at least two octaves above the maximum in-band frequency. In the preferred embodiment, the maximum in-band frequency is at least one GHz therefore the gain and stability of active section 11 must be controlled to at least four GHz. Also in this embodiment, capacitors 17 and 18 have a value of approximately 0.2 picofarads.

A pair of connection points 39 provide a means for attaching output coupling section 23 directly to active section 11. Feedback sections 21 and 22, biasing sections 26a and 26b, and input section 24 are operating at frequencies in the operating band and are not associated with the high frequencies in the out-of-band range. The operation of feedback sections 21 and 22, and biasing sections 26a and 26b of such amplifiers are well known in the art and will not be discussed in detail herein. However, input coupling section 24 and output coupling section 23 are unique and will be discussed hereinafter.

Active section 11 generates a substantial amount of heat which must be dissipated in order to prevent damage to amplifier 10. The technique that is utilized for removing the heat must have a very low cost, yet it must not have large parasitic inductance and capacitance that reduces the bandwidth of linear amplifier 10.

Figure 2:
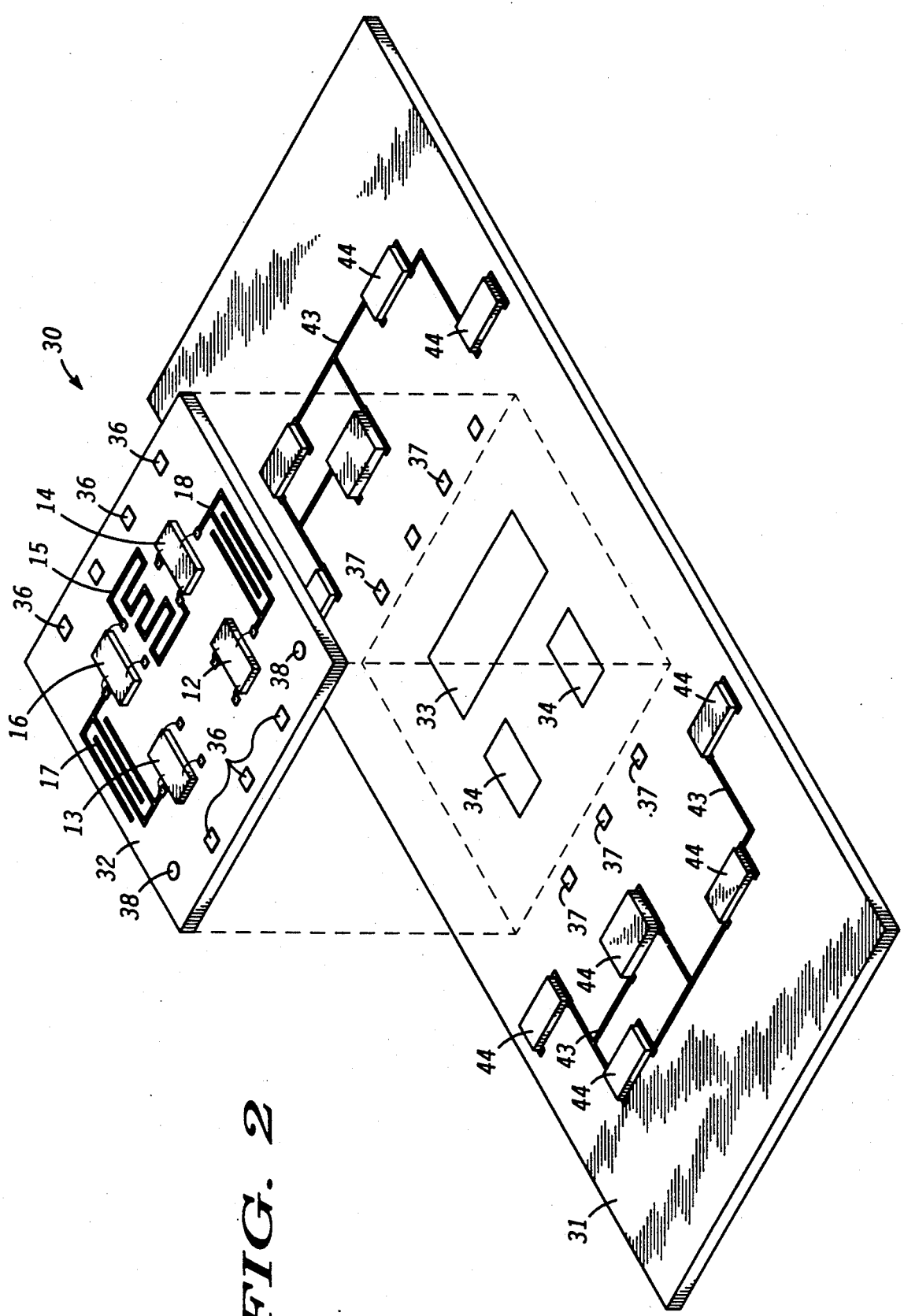
FIG. 2 is an exploded isometric view of an embodiment of a linear amplifier assembly illustrating a daughter board attached to a mother board in accordance with the present invention.

FIG. 2 illustrates an exploded view of a portion of a linear amplifier assembly 30 which includes a daughter board 32 that is attached to a mother board 31. Amplifier assembly 30 is used for assembling and housing a wide bandwidth high frequency amplifier. Efficient dissipation of heat generated by the amplifier is achieved by utilizing materials of different thermal conductivity and different cost for mother board 31 and daughter board 32. Daughter board 32 is a material that has high thermal conductivity and can be utilized to dissipate the heat that is developed in an amplifier such as in active stage 11 shown in FIG. 1. Mother board 31 is a low cost material that is suitable to be used as a substrate for mounting daughter board 32 and the remaining components of an amplifier such as of amplifier 10 shown in FIG. 1. Generally, the material used for daughter board 32 has a higher cost than the material used for mother board 31, therefore daughter board 32 is utilized for high power dissipation active components and associated critical components that control the gain and high frequency stability of the amplifier. This configuration reduces parasitic inductance and capacitance while minimizing the cost of linear amplifier assembly 30. In the preferred embodiment, mother board 31 is alumina and daughter board 32 is either aluminum nitride or beryllium oxide.

Daughter board 32 is a subassembly that is constructed and then attached to mother board 31. The top surface of daughter board 32 has a metallized area for attaching components and a metallized pattern for interconnecting the components. The components of active section 11 from FIG. 1 are shown mounted to daughter board 32. In order to minimize parasitic inductances and capacitances, it is important to have all of the critical high frequency components on daughter board 32. Since capacitors 17 and 18 control the gain and stability of transistors 12, 13, 14, and 16, it is important to have these components on daughter board 32 along with resistor 15. Capacitors 17 and 18 typically have a very small value and are formed as a series of interdigitized fingers that are metallized on the surface of daughter board 32. Resistor 15 also has a small value and is typically formed as a thin film resistor on the surface of daughter board 32. Transistors 12, 13, 14, and 16 are usually attached to daughter board 32 by a standard die bonding technique that is well known in the art. Then, wire bonding is used to electrically connect transistors 12, 13, 14, and 16 to the interconnect pattern on daughter board 32. Parasitic inductance on the base of transistors 12 and 13, and on the emitter of transistors 14 and 16 is minimized by utilizing stitch bonding to provide double wire bonds on the corresponding bonding pads. Stitch bonding is a method of effectively applying two wires to a bonding pad in one bonding operation to the pad. If a bonding pad "A" is to be connected to two bonding pads "1" and "2", a first bond is made to pad "1" then the bonding wire is attached to bonding pad "A" then to bonding pad "2" where the wire is cut after the bonding. This effectively provides two wires to bonding pad "A" with only one bonding operation. In the present invention, both of the stitch bonded wires attached to each base are formed of equal length to ensure equal current flow through each wire. Since transistors 12, 13, 14, and 16 are attached directly to daughter board 32, the wire bonds are short which minimizes the parasitic inductance in the section of the linear amplifier that operates at the high out-of-band frequencies. Daughter board 32 also has two output pads 38 which permit connecting output coupling stage 23 of FIG. 1 directly to transistors 12 and 13 as shown by connecting points 39 of FIG. 1. Consequently, all of the critical components that operate at high out-of-band frequencies and control the stability of the linear amplifier are interconnected on daughter board 32. This configuration permits reducing the parasitic inductance and capacitance values associated with these interconnections thereby improving the stability of the linear amplifier assembly.

After daughter board 32 has been assembled, it can be attached to mother board 31 by a reflow solder (or other similar) process that is used to attach the remaining linear amplifier components to mother board 31. For simplicity, the remaining linear amplifier components are represented by a plurality of components 44 which are directly attached to mother board 31 and interconnected by a plurality of conductors 43 on the surface of mother board 31. Components 44 and conductors 43 are shown to assist in illustrating the relationship between mother board 31 and daughter board 32, and are not intended to represent all of the components in linear amplifier 10 of FIG. 1. A metal stripe 33 and two metal pads 34 on the surface of mother board 31 facilitate attaching daughter board 32 to mother board 31 by mating to similar metallized areas on the back surface of daughter board 32. The reflow solder process solders the metallized area on daughter board 32 to metal stripe 33 and metal pads 34 on mother board 31. After daughter board 32 has been mechanically attached to mother board 31, daughter board 32 is electrically connected to mother board 31 by wire bonding a plurality of bonding pads 36 on daughter board 32 to a plurality of bonding pads 37 on mother board 31. Since the components that are interconnected by these wire bonds only function in the working band frequencies, these wire bonds do not add parasitic inductance that effects the stability of the linear amplifier assembly. Utilizing a high thermal conductivity daughter board to mount high power dissipation components in addition to critical stability and gain control components, and attaching the daughter board to a low cost mother board along with other circuit components provides a low cost amplifier assembly that has low parasitic inductance and capacitance.

FIG. 3 illustrates the bottom of daughter board 32 which is used to mechanically attach daughter board 32 to mother board 31 (of FIG. 2). A metal stripe 41 mates to metal stripe 33 of mother board 31 (FIG. 2), and two small metal pads 42 mate to metal pads 34 on mother board 31 (FIG. 2). Metal stripe 41 is on the surface opposite transistors 14 and 16 while one metal pad 42 is opposite transistor 12 and the other metal pad 42 is opposite transistor 13. These metal stripes are placed on the surface opposite the transistors to assist in transferring heat from the transistors to the mother board. In order to minimize the parasitic collector to ground capacitance of transistors 12 and 13, metal pads 42 are electrically isolated from each other, from metal stripe 41, from electrical potentials, and from transistors 12, 13, 14, and 16. Minimizing and isolating the parasitic capacitance induced by metal pads 42 further increases the bandwidth and stability of the amplifier that includes transistors 12, 13, 14, and 16.

FIG. 4 is a simplified schematic of in-phase transistors 12 and 14 from FIG. 1 illustrating a portion of the parasitic inductors and capacitors whose values are reduced by the use of daughter board 32. A base inductor 46 is formed by the wire bond to the base of transistor 14. Similarly, an emitter inductor 47 is created by stitched wire bonds to the emitter of transistor 14. Another emitter inductor 48 is formed by the wire bond to the emitter of transistor 12, and another base inductor 49 is formed by the stitched wire bonds to the base of transistor 12. The collector of transistor 14 has a parasitic collector to ground capacitor 51 and a similar parasitic capacitor 52 is coupled between the collector of transistor 12 and ground. Power supply return terminal 28 and active section connection point 39 are shown for reference. The table below compares the parasitic component values that are obtained by use of previous linear amplifier assembly techniques (PREVIOUS VALUE), and the values obtained using the method of the present invention (CURRENT VALUE). The PERCENT REDUCTION column shows how the method of the present invention has reduced the value of the parasitic inductors and capacitors:

| PARASITIC ELEMENT | PREVIOUS VALUE | CURRENT VALUE | PERCENT REDUCTION |
| --- | --- | --- | --- |
| Base Inductor 46 | 1.39 nh | 0.80 nh | 43% |
| Emitter Inductor 47 | 0.69 nh | 0.40 nh | 42% |
| Base Inductor 49 | 1.39 nh | 0.40 nh | 71% |
| Emitter Inductor 48 | 1.75 nh | 0.80 nh | 54% |
| Collector-Ground Capacitor 51 | 0.5 pf | 0.25 pf | 50% |
| Collector-Ground Capacitor 52 | 0.7 pf | 0.3 pf | 57% |

The double wire bonds on the base of transistor 12 and the emitter of transistor 14 significantly reduces the value of parasitic inductors 47 and 49 as shown in the table above. It should be noted that capacitor 52 also includes the capacitance of connection point 39. By using a daughter board construction technique such as that shown by assembly 30 in FIG. 2, parasitic inductor and capacitor values of a linear amplifier can be reduced, thereby creating a linear amplifier that has a low cost, a wide bandwidth, and unconditional stability at frequencies in excess of 1 GHz.

FIG. 5 is a graph illustrating the performance improvement that is obtained by constructing a high frequency linear amplifier assembly using the daughter board technique shown in FIG. 2. The ordinate indicates amplifier gain in db and the abscissa indicates frequency in megahertz. A graph 53 illustrates the gain of a previous linear amplifier. Generally, the previous amplifier's gain was substantially flat until the frequency approached 600 MHz, then the gain rolled off quite abruptly as shown by graph 53. A graph 54 illustrates the gain of a linear amplifier that utilizes a daughter board technique such as that shown in FIG. 2. The gain is substantially flat well past the 600 MHz limit of previous amplifier assemblies and begins to roll off at frequencies in excess of approximately 1 GHz. It should be noted that the transistors used to produce graphs 53 and 54 were the identically same transistors. That is, the data of graph 53 was measured from an amplifier using a set of transistors, then the transistors were removed and used to construct the amplifier that provided graph 54. Consequently, the comparison between graph 53 and 54 is independent of the transistors used to construct the amplifier and shows the performance improvement that is obtained by the parasitic element reduction of the daughter board assembly technique.

Referring back to FIG. 1, the unconditional stability that is provided by reducing the value of the amplifier's parasitic elements has an additional benefit. Previous linear amplifier assemblies were conditionally stable which required the use of a conventional transformer in the previous amplifier's input coupling stage and output coupling stage. Conventional transformers typically become unbalanced at high frequencies and reduce the amplifier's gain at those frequencies. The conventional transformer's gain reduction was necessary to maintain the previous amplifier's stability and prevent previous amplifiers from oscillating. Since the daughter board assembly technique creates an unconditionally stable amplifier by reducing the parasitic inductance and capacitance values, it is not necessary to reduce the amplifier's gain to prevent oscillations. The unconditional stability permits the use of a wide bandwidth transmission line transformer 20 in input coupling section 24, and a wide bandwidth transmission line transformer 29 in output coupling section 23. Utilizing the transmission line transformer's wide bandwidth further increases the bandwidth of linear amplifier assembly 30 shown in FIG. 2. Transformer 29 is also used to couple power supply terminal 27 to the components of linear amplifier 10. The voltage of power supply terminal 27 is blocked from output terminal 45 of linear amplifier 10 by two blocking capacitors 40. Similarly, two blocking capacitors 25 block the voltage of power supply terminal 27 from input terminal 19.

By now it should be appreciated that there has been provided a novel way to create a high frequency linear amplifier assembly. Attaching the critical high frequency components and the high power dissipation components to a high thermal conductivity daughter board reduces parasitic capacitance and parasitic inductance which improves the bandwidth and stability of the linear amplifier assembly. The linear amplifier assembly is unconditionally stable at frequencies well beyond the operating band of the amplifier. The increased bandwidth is required for the increased CATV channel allotment and for direct broadcast television.

The daughter board approach of the present invention provides the improved bandwidth at a low manufacturing cost.

While the invention is described with specific preferred embodiments, it is evident that many alternatives and variations will be apparent to those skilled in the art. More specifically the invention has been described for a particular linear amplifier circuit as well as for a particular linear amplifier assembly that has a particular mother board and daughter board structure, although the method of utilizing a high thermal conductivity daughter board is directly applicable to other amplifier circuits, as well as to other amplifier assemblies that have a different mother board and daughter board structure.

We claim:

1. A high frequency linear amplifier assembly comprising:
   an active section;
   a daughter board having a first thermal conductivity and also having the active section attached to a first surface of the daughter board to reduce parasitic inductance wherein the daughter board provides a means for dissipating heat generated by the active section;
   a plurality of metal areas on a second surface of the daughter board wherein each of the metal areas is electrically isolated;
   a first feedback section;
   a second feedback section;
   an input coupling section;
   an output coupling section;
   a biasing section; and
   a mother board that has the first feedback section, the second feedback section, the input coupling section, the output coupling section, the biasing section, and the daughter board on the mother board, wherein the mother board has a second thermal conductivity that is less than the first thermal conductivity, and the daughter board is electrically connected to the mother board by wire bonds.

2. The high frequency amplifier of claim 1 further including the daughter board attached to the mother board by soldering the plurality of metal areas on the second surface of the daughter board to a plurality of metal areas on the mother board.

3. The high frequency amplifier of claim 1 wherein the active section includes a plurality of transistors connected in a cascode push-pull circuit configuration, and also includes components that control high frequency out-of-band stability and high frequency out-of-band gain of the cascode push-pull circuit.

4. The high frequency amplifier of claim 1 wherein the mother board is an alumina mother board.

5. The high frequency amplifier of claim 1 wherein the daughter board is an aluminum nitride daughter board.

6. The high frequency amplifier of claim 1 wherein the daughter board is a beryllium oxide daughter board.

7. A high frequency amplifier comprising:
   a first section that produces a majority of heat that is produced by the amplifier wherein the first section includes an active section having elements that substantially control high frequency out-of-band stability and that substantially control high frequency out-of-band gain of the amplifier and wherein the elements include a semiconductor die and passive components of the amplifier;
   a daughter board having a first thermal conductivity wherein the elements of the first section are mounted on the daughter board to reduce parasitic inductance of the elements and parasitic capacitance of the elements thereby improving the stability of the amplifier; and
   a mother board that is formed from a material that has a thermal conductivity that is lower than the first thermal conductivity wherein the daughter board is on the mother board.

8. The high frequency amplifier of claim 7 wherein the daughter board is formed from an aluminum nitride material.

9. The high frequency amplifier of claim 7 wherein the daughter board is formed from a beryllium oxide material.

10. The high frequency amplifier of claim 7 further including a wide bandwidth transmission line transformer, which is void of a center tap, to couple an input to the first section.

11. The high frequency amplifier of claim 7 further including the daughter board mechanically attached to the mother board by soldering.

12. The high frequency amplifier of claim 7 further including the daughter board electrically connected to the mother board by bonding wires.

13. The high frequency amplifier of claim 7 wherein the mother board is formed from alumina.

14. A method of increasing the operating frequency of a circuit comprising:
   placing on a daughter board elements of a circuit that control high frequency out-of-band stability of the circuit and elements of the circuit that control high frequency out-of-band gain of the circuit for the purpose of reducing parasitic inductance and parasitic capacitance of the elements thereby improving high frequency stability of the amplifier wherein the daughter board has a high thermal conductivity;
   placing the daughter board and other elements of the circuit on a mother board having a thermal conductivity that is less than the high thermal conductivity of the daughter board; and
   attaching the daughter board to the mother board and electrically connecting the daughter board to the mother board.

15. The method of claim 14 wherein the placing on a daughter board step includes placing the elements of the circuit on a beryllium oxide daughter board.

16. The method of claim 14 wherein the placing on a daughter board step includes placing the elements of the circuit on an aluminum nitride daughter board.

17. The method of claim 14 wherein the placing on a daughter board step includes placing the elements of a push-pull cascode circuit on the daughter board.

18. The method of claim 14 wherein attaching the daughter board to the mother board includes soldering the daughter board to the mother board at the same time the other elements of the amplifier are soldered to the mother board.

19. The method of claim 14 further including coupling an input signal to the circuit by using a wide bandwidth transmission line transformer.

20. The method of claim 14 further including using a wide bandwidth transmission line transformer to couple the circuit to an output terminal.

* * * * *